United States Patent
Seward et al.

(10) Patent No.: US 7,884,684 B1
(45) Date of Patent: Feb. 8, 2011

(54) RADIO FREQUENCY MULTIPLEXER FOR COUPLING ANTENNAS TO AM/FM, CB, AND TELEVISION APPARATUS

(75) Inventors: Glen J. Seward, Cincinnati, OH (US); Robert B. Ennenga, Grand Haven, MI (US); Paul E. Miller, Spring Lake, MI (US)

(73) Assignee: R.A. Miller Industries, Inc., Grand Haven, MI (US)

( * ) Notice: Subject to any disclaimer, the term of this patent is extended or adjusted under 35 U.S.C. 154(b) by 207 days.

(21) Appl. No.: 12/196,852

(22) Filed: Aug. 22, 2008

Related U.S. Application Data

(60) Provisional application No. 60/957,741, filed on Aug. 24, 2007.

(51) Int. Cl.
*H03H 7/46* (2006.01)
*H03H 7/38* (2006.01)
*H04B 1/18* (2006.01)

(52) U.S. Cl. .................. 333/129; 333/132; 455/82; 370/201; 343/850; 348/729

(58) Field of Classification Search .............. 333/126, 333/129, 132, 134; 455/74, 78, 82; 370/201; 348/729; 343/850, 858
See application file for complete search history.

(56) References Cited

U.S. PATENT DOCUMENTS

| | | | | |
|---|---|---|---|---|
| 3,824,599 | A * | 7/1974 | Haswell | 343/822 |
| 4,037,177 | A * | 7/1977 | Tyrey | 333/32 |
| 4,095,229 | A * | 6/1978 | Elliott | 343/715 |
| 4,141,016 | A * | 2/1979 | Nelson | 343/858 |
| 4,157,547 | A * | 6/1979 | Freimark et al. | 455/74 |
| 4,268,805 | A * | 5/1981 | Tanner et al. | 333/129 |
| 4,416,023 | A * | 11/1983 | Michoff | 455/291 |
| 5,345,247 | A * | 9/1994 | Aldama et al. | 343/791 |
| 5,634,203 | A * | 5/1997 | Ghaem | 455/134 |
| 5,652,599 | A * | 7/1997 | Pitta et al. | 343/858 |
| 5,734,352 | A * | 3/1998 | Seward et al. | 343/722 |
| 6,107,972 | A * | 8/2000 | Seward et al. | 343/722 |
| 6,297,711 | B1 | 10/2001 | Seward et al. | |
| 6,384,696 | B1 * | 5/2002 | Miller et al. | 333/132 |
| 6,396,365 | B1 * | 5/2002 | Miller et al. | 333/129 |
| 6,864,924 | B2 * | 3/2005 | Yamamoto | 348/731 |

\* cited by examiner

*Primary Examiner*—Barbara Summons
(74) *Attorney, Agent, or Firm*—McGarry Bair PC

(57) ABSTRACT

A multiplexer circuit for CB, AM/FM, and television splits the radio and television signals, adding impedance to the split lines, and providing an amplifier upstream of the split.

10 Claims, 2 Drawing Sheets

RADIO FREQUENCY MULTIPLEXER FOR COUPLING ANTENNAS TO AM/FM, CB, AND TELEVISION APPARATUS

BACKGROUND OF THE INVENTION

1. Field of the Invention

The invention pertains to antennas and multiplexers more particularly to multiplexers for use with antennas and receiving apparatus operating in the AM/FM, CB and television frequency ranges.

2. Prior Art

It is known to use multiband antennas coupled to multiplexers in systems capable of receiving AM/FM and weather band signals and transmitting and receiving CB and cellular phone signals. See, for example, commonly assigned U.S. Pat. No. 6,297,711 to Seward, et al. In recent years, the technology of cellular telephones has progressed to the point where coupling a cellular telephone to a vehicular antenna is unnecessary.

At the same time, there is increased demand to provide television reception in vehicles, particularly in commercial trucking and in marine environments. In the trucking industry, separate "Vee" antennas are typically installed in the headliner of composite bodied trucks, and in the marine industry, similar separate television antennas are used for television reception, apart from the other communication antennas and antennas for conventional AM/FM reception.

There remains a need to minimize the number of antennas in use, and the now unused cellular port in known multiplexers provides a convenient port for a television signal from a multiband antenna. But the solution is not as simple as replacing the cellular port on the multiplexer with a television port. One problem with incorporating television reception on existing multiband antenna systems is that FM frequencies are between television channels 6 and 7, so that splitting like frequencies over two receivers (one FM and one television) reduces the signal to each. In addition, the receivers tend to load the system which results in greater losses and degradation of the signals. The problem of incorporating television reception into existing multiband antenna systems remains.

SUMMARY OF THE INVENTION

These and other problems of the prior art are overcome in accordance with this invention by means of a multiplexer circuit for coupling at least one antenna to a CB receiving apparatus, to an FM receiving apparatus, and to a television receiving apparatus. The multiplexer circuit includes an input conductor adapted to connect to at least one antenna, a first output conductor adapted to connect to a CB radio apparatus, a second output conductor adapted to connect to a television receiving apparatus, and a third output conductor adapted to connect to an FM receiving apparatus. A first inductor and a first capacitor are connected in series to form a series LC circuit between the input conductor and the first output conductor. The series LC circuit is configured to provide low impedance to signals inside the CB frequency range and high impedance to signals outside the CB frequency range. A second inductor and a second capacitor are connected in parallel to form a parallel LC circuit between the input conductor and a line extending to the second and third output conductors. The parallel LC circuit is configured to provide high impedance to signals inside the CB frequency range. The multiplexer also has a node in the line where the line is split into the second and third conductors.

Preferably, the third conductor is adapted to connect to an FM/AM receiving apparatus connected to the third output conductor. The multiplexer can further have a resistor in each of the second and third conductors. As well, the multiplexer can further have an amplifier between the parallel L-C circuit and the node.

BRIEF DESCRIPTION OF THE DRAWINGS

An illustrative embodiment of the invention is described below with reference to the drawing in which.

DETAILED DESCRIPTION

Figure 1:
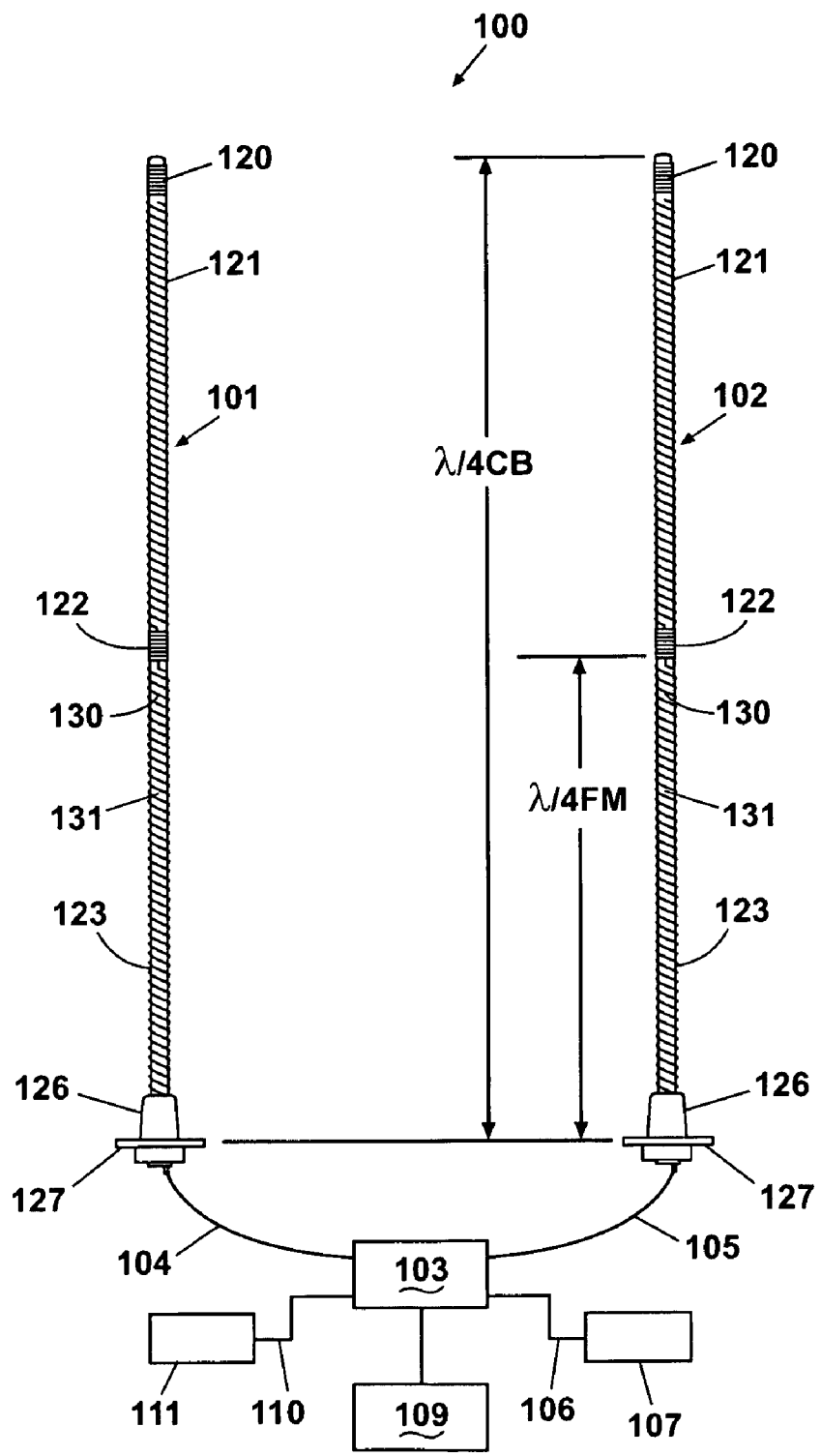
FIG. 1 is a diagrammatic representation of a dual CB/AM/FM/television antenna system incorporating the principles of the invention.

FIG. 1 shows an antenna system 100 comprising a pair of identical antennas 101, 102. The antennas 101, 102 are connected to a multiplexer 103, according to the invention, via input conductors 104, 105, respectively. The multiplexer 103 serves to connect the antennas to an AM/FM receiver 107 via conductor 106, to a television receiver 109 via conductor 108 and to a CB transceiver 111 via conductor 110. Each of the antennas is mounted by means of a mounting nut 126 on a bracket 127 which may, for example, be a side mirror mounting bracket of a truck. The overall antenna is preferably on the order of 54 inches in length. The antennas each may comprise an enamel coated conductive antenna wire 130 wound around an essentially cylindrically shaped core 131. The core 131 may be a solid core of fiberglass or the like material having a diameter of ¼ inch. The wire of each antenna preferably extends continually from the top of the core 131 to the mounting nut 126 where each antenna is connected to the multiplexer 103 via one of the conductors 104, 105. The wire section from the mounting nut 126 to the upper end of the rod 131 has an electrical length of one-quarter wavelength in the CB frequency range.

The overall length of the wire 130 includes a tightly wound loading coil 120 at the top of each antenna as well as the wire section 121 extending between the loading coil 120 and an FM self-resonant circuit 122. In the FM self-resonant circuit the successive turns of the wire 130 are immediately adjacent each other. The successive turns of the wire 130 are spaced apart in the area 123 between the FM self-resonant circuit 122 and mounting nut 126. The electrical length of the wire section from the mounting nut 126 to the lower end of the FM self-resonant circuit 122 has an electrical length of preferably one-quarter wavelength in the FM frequency range. This electrical length works also for television because the television band is generally from 54 to about 890 MHz, both above and below the standard FM band of 88-108 MHz.

It will be understood that the antenna is exemplary only, for showing the environment in which the invention operates. More or less than two antennas may be used depending on performance requirements or expectations. As well, different types of antennas may be used. For example, a loop or bow tie antenna may be added or equivalently incorporated into an existing antenna to improve TV reception in the UHF range.

Figure 2:
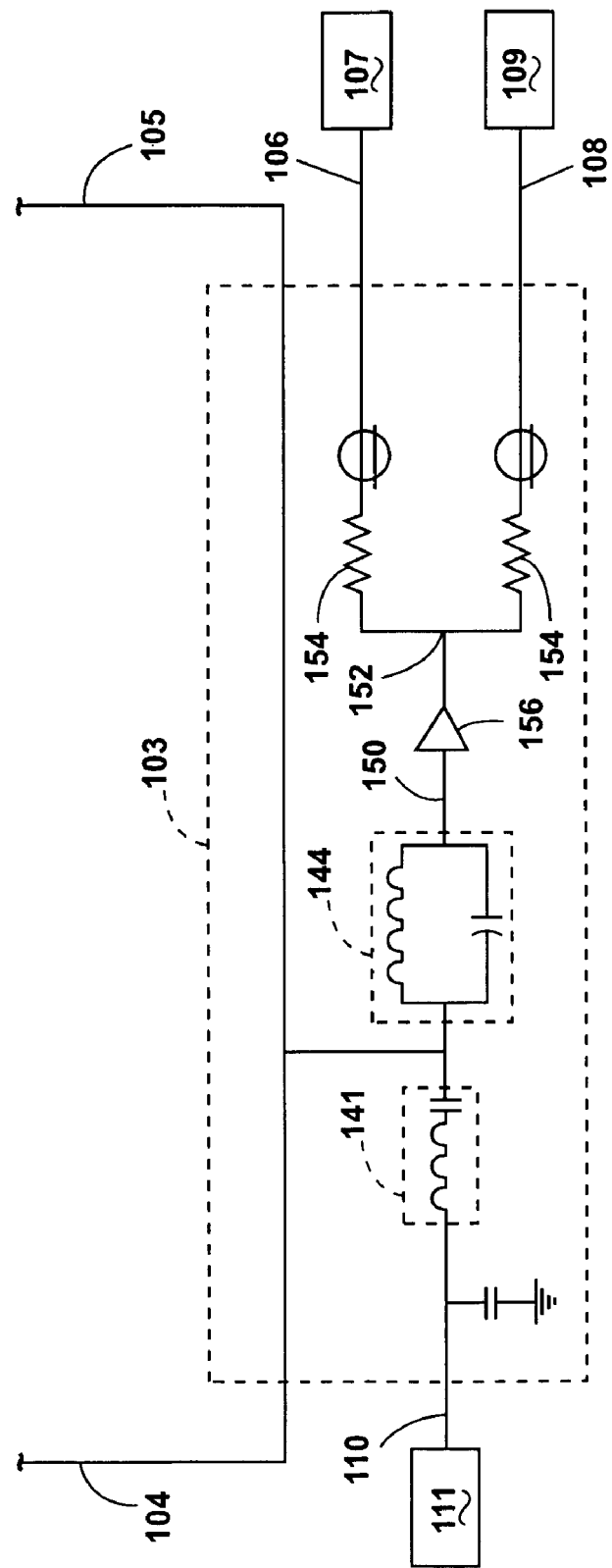
FIG. 2 is a circuit diagram of the multiplexer of FIG. 1.

FIG. 2 schematically shows an exemplary circuit of the multiplexer 103 which provides an interface to the CB transceiver 111 via conductor 110, to AM/FM receiver 107 via conductor 106, and to the television 109 via conductor 108. A series LC circuit 141 is configured to offer low impedance to the CB signal and high impedance to the AM/FM and television signals to avoid loading the AM/FM receiver or the television when the CB transceiver is operating. A parallel LC circuit 144 is configured to provide high impedance at 27 MHZ, thereby isolating the CB transmitter from the AM/FM receiver and the television, and preventing damage to them when transmitting with the CB. Since both the AM/FM receiver 107 and the television are at high impedances when not tuned to the frequency of interest, these units could extend from the same line 150 by way of a splitter at node 152. However, since both the television 109 and the AM/FM receiver 107 will typically be several feet from the node 150, several feet of coaxial cable are typically used for each device. If the unused device is an odd multiple of quarter wavelengths away from the node 150, it would present very low impedance in parallel and therefore greatly degrade the performance of the device in use. In order to minimize this problem, a resistor 154 is placed in series with both the FM/AM receiver 107 and the television 109, preferably about 75 Ohms. This, however, creates a secondary problem because it reduces the performance of both the AM/FM receiver 107 and the television 109 by about 3 dB when the cable's length is an even number of quarter wavelengths and by about 8 dB when the cable's length is a multiple of odd quarter wavelengths. In order to solve this problem, an amplifier 156 is disposed in the cable 150 upstream of the node split 152. The resistors 154 and the amplifier 156 sufficiently isolate the television 109 and the AM/FM receiver 107 and maintain optimum signal levels.

What is claimed is:

1. A multiplexer circuit for coupling at least one antenna to a CB receiving apparatus operative in a CB frequency range, to an FM receiving apparatus, and to a television receiving apparatus, the multiplexer circuit comprising:
   an input conductor adapted to connect to at least one antenna;
   a first output conductor adapted to connect to a CB radio apparatus;
   a second output conductor adapted to connect to a television receiving apparatus;
   a third output conductor adapted to connect to an FM receiving apparatus;
   a first inductor and a first capacitor connected in series to form a series LC circuit between the input conductor and the first output conductor configured to provide low impedance to signals inside the CB frequency range and high impedance to signals outside the CB frequency range;
   a second inductor and a second capacitor connected in parallel to form a parallel LC circuit between the input conductor and a line extending to the second and third output conductors configured to provide high impedance to signals inside the CB frequency range; and
   a node in the line where the line is split into the second and third conductors.

2. The multiplexer circuit according to claim 1 wherein the third output conductor is configured for connection to an FM/AM receiving apparatus.

3. The multiplexer circuit according to claim 2 further comprising an amplifier between the parallel LC circuit and the node.

4. The multiplexer circuit according to claim 1 further comprising a resistor in each of the second and third conductors.

5. The multiplexer circuit according to claim 4 further comprising an amplifier between the parallel LC circuit and the node.

6. The multiplexer circuit according to claim 4 wherein the impedance of each resistor is selected to match the characteristic impedance of the respective one of the second and third conductors.

7. The multiplexer circuit according to claim 6 further comprising an amplifier between the parallel LC circuit and the node.

8. The multiplexer circuit according to claim 1 further comprising an amplifier between the parallel LC circuit and the node.

9. A multiplexer circuit for coupling at least one antenna to CB radio apparatus operative in a CB frequency range and to a television receiving apparatus, the multiplexer circuit comprising:
   an input conductor adapted to connect to the at least one antenna, and connected to a first output conductor for connection to a CB radio apparatus and a second output conductor for connection to a television receiving apparatus, and a third output conductor for connection to an FM/AM receiver;
   a series LC circuit connected between the input conductor and the first output conductor and comprising a first inductor and a first capacitor connected in series with the first inductor and providing blocking impedance to signals outside the CB frequency range;
   a parallel LC circuit connected between the input conductor and the second output conductor and comprising a second inductor and a second capacitor connected in parallel and providing blocking impedance to signals inside the CB frequency range wherein the connection between the parallel L-C circuit and the second and third output conductors is split into a television conductor connected to the second output conductor and an FM/AM conductor connected to the third output conductor; and
   an amplifier between the parallel LC circuit and the split.

10. The multiplexer circuit according to claim 9 further comprising a resistor in each of the television conductor and FM/AM conductor.

* * * * *